United States Patent
Atnip et al.

(10) Patent No.: US 8,120,155 B2
(45) Date of Patent: Feb. 21, 2012

(54) REDUCED STICTION AND MECHANICAL MEMORY IN MEMS DEVICES

(75) Inventors: Earl V. Atnip, Plano, TX (US); Simon Joshua Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 840 days.

(21) Appl. No.: 12/183,601

(22) Filed: Jul. 31, 2008

(65) Prior Publication Data

US 2010/0025832 A1 Feb. 4, 2010

(51) Int. Cl.
*H01L 23/26* (2006.01)
*H01L 21/54* (2006.01)

(52) U.S. Cl. ............ 257/682; 257/687; 257/E23.137; 257/E23.002; 257/E21.501; 438/115; 438/476; 438/477

(58) Field of Classification Search .......... 257/682, 257/687, E23.002, E23.137, E21.501; 438/115, 438/127, 471, 476, 477
See application file for complete search history.

(56) References Cited

U.S. PATENT DOCUMENTS

| | | | |
|---|---|---|---|
| 5,331,454 A | 7/1994 | Hornbeck | |
| 5,602,671 A | 2/1997 | Hornbeck | |
| 6,204,085 B1 | 3/2001 | Strumpell | |
| 6,259,551 B1 | 7/2001 | Jacobs | |
| 6,285,079 B1 * | 9/2001 | Kunikiyo | 257/737 |
| 6,624,944 B1 | 9/2003 | Wallace | |
| 6,843,936 B1 * | 1/2005 | Jacobs | 252/194 |
| 7,090,787 B2 | 8/2006 | Malone | |
| 7,256,467 B2 | 8/2007 | Reid | |
| 7,362,494 B2 | 4/2008 | Huibers | |
| 2005/0285256 A1 * | 12/2005 | Jiang et al. | 257/701 |
| 2008/0160268 A1 | 7/2008 | Jacobs | |

OTHER PUBLICATIONS

"'Heftier' Atoms Reduce Friction At The Nanoscale, Study Reveals", ScienceDaily [online], Nov. 2, 2007, [retreived on Feb. 11, 2008] Retrieved from the Internet <URL: http:///www.sciencedaily.com/releases/2007/11/071101170719.htm>.

"Heavier Hydrogen On The Atomic Scale Reduces Friction", ScienceDaily [online], Nov. 6, 2007, [retreived on Feb. 11, 2008] Retrieved from the Internet <URL: http://www.sciencedaily.com/releases/2007/11/071102163021.htm>.

* cited by examiner

*Primary Examiner* — David Vu
*Assistant Examiner* — Earl Taylor
(74) *Attorney, Agent, or Firm* — Warren L. Franz; Wade J. Brady, III; Frederick J. Telecky, Jr.

(57) ABSTRACT

A MEMS device is packaged in a process which hydrogen (H) deuterium (D) for reduced stiction. H is exchanged with D by exposing the MEMS device with a deuterium source, such as deuterium gas or heavy water vapor, optionally with the assistance of a direct or downstream plasma.

32 Claims, 2 Drawing Sheets

REDUCED STICTION AND MECHANICAL MEMORY IN MEMS DEVICES

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to integrated circuit packaging and, more particularly, to packaging micromechanical devices with reduced stiction and mechanical memory.

2. Description of the Related Art

Electronic devices such as integrated circuits are often packaged in hermetically sealed enclosures. These enclosures protect the device from contaminants, particles, and water vapor that would otherwise enter the package and mechanically damage or electrically disrupt the device. MEMS (microelectromechanical system) devices are small structures typically fabricated on a semiconductor wafer using techniques such as optical lithography, doping, metal sputtering, oxide deposition, and plasma etching which have been developed for the fabrication of integrated circuits.

Micromirror devices, sometimes referred to as DMDs (digital micromirror devices), are a type of MEMS device. Micromirror devices are primarily used in optical display systems. In display systems, the micromirror is a light modulator that uses digital image data to modulate a beam of light by selectively reflecting portions of the beam of light to a display screen. While analog modes of operation are possible, micromirrors typically operate in a digital bistable mode of operation and as such are the core of the first true digital full-color image projection systems. Other types of micromechanical devices include accelerometers, pressure and flow sensors, gears and motors. For some micromechanical devices, such as DMDs, it is important to maintain a very specific moisture level within the package, where the moisture level remains relatively steady over time.

Getters are compounds that capture contaminants, moisture vapor, and particles, are included inside the device enclosures to trap these species and preclude degradation of device performance, thereby increasing the operational lifetime of the device. Various getter compounds are available depending on the environment to which the getter will be subjected. The getter compound used in a DMD sinks moisture when the moisture level is too high and sources moisture when the moisture level is too low.

Many micromechanical devices include moving components that place unique demands on surface lubrication and passivation systems. For example, the deflectable element of a micromirror device rotates about a torsion beam hinge axis and is stopped by contact with a landing zone or spring structure. The contact point experiences metal-to-metal contact and some scrubbing action. This metal-to-metal contact can create static friction (stiction) between the components. Stiction is caused by the capillary action of water vapor present on the surface, van der Waals attraction, and intermetallic bonding of the metals. Stiction becomes worse as the contacting surfaces wear against each other since the contact area is increased.

Passivation coatings on micromirror devices reduce stiction and wear between the contacting surfaces. One passivation material that is especially useful for micromirror devices is a perfluoroalkanoic acid such as perfluorodecanoic acid (PFDA). PFDA, as taught by U.S. Pat. No. 5,331,454, issued Jul. 19, 1994 and entitled Low Voltage Reset for DMD, which is incorporated by reference herein, provides an oriented monolayer on the surfaces of the DMD. The oriented monolayer provides a chemically inert surface that reduces the stiction between adjacent metal parts.

While the PFDA reduces stiction problems, it would be beneficial to reduce stiction further. Therefore, there is a need for an improved method and system reducing stiction in a MEMS device.

BRIEF SUMMARY OF THE INVENTION

In the present invention, a MEMS device is packaged by placing the MEMS device in a package and introducing a vapor including deuterium into the package. The package is then sealed.

The present invention provides significant advantages over the prior art. First, the static friction between contacting surfaces of MEMS components is reduced. Second, deuteration of bound water, hydrogen, PFDA and other species reduces the bonding vibrational constants for the D-X bonds. Third, reducing the isomerization, exchange and atom transfer rates of surface reactions of metal oxides reduces deformation of MEMS components.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1-5 of the drawings, like numerals being used for like elements of the various drawings.

For many years, it has been known that a low surface energy passivation layer can reduce friction in a MEMS device, as demonstrated in U.S. Pat. Nos. 5,331,454, 5,602,671, 6,259,551, 6,624,944, 6,843,936 and 7,090,787, all of which are assigned to Texas Instruments Incorporated and are incorporated by reference herein.

The present invention replaces covalent and hydrogen bonds between hydrogen (H) and the surface of a MEMS device with deuterium (D) for reduced stiction and other benefits. H is exchanged for D by exposing the MEMS device to a deuterium source, such as deuterium gas or heavy water vapor, optionally with the assistance of a direct or downstream plasma. By deuterating the surface of the MEMS device, several benefits accrue as described herein, including reduced stiction. Replacing H with D increases the vibration force constant of the D-X bond. This reduces vibrational frequency and the zero point energy for the bonds. Reducing the vibrational frequency reduces the energy loss of a contacting or sliding surface. Reducing the zero point energy reduces the reaction rate for the compounds; the variation of a chemical reaction when an atom in one of the reactants (H) is replaced by one of its isotopes (D) is known as the kinetic isotope effect (KIE). The KIE can be calculated from the reaction rate constants of $k_H$ and $k_D$, $KIE=k_H/k_D$. Depending upon the chemical moiety bonded to the D-atom, the KIE range is from 3-25. Thus, substituting D for H can significantly reduce reaction rates on the surface of a MEMS device. Reactions which result in a substitution of D for H may include (but are not limited to): degradation or desorption of lubricant molecules which assist in reliable operation of the MEMS device, hydrogen or deuterium transfer reactions to or among hydrated surface oxide states, and the like.

Figure 1:
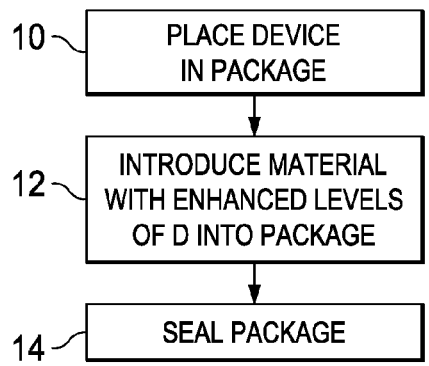
FIG. 1 is a flow diagram of the invention.

FIG. 1 is a flow diagram providing the basic steps of the invention. In step 10 a MEMS device is placed in a package. In step 12, a material including enhanced levels of deuterium is introduced in the package (this step may occur before step 10). In step 14, the package is sealed.

In a first embodiment of the present invention, water vapor ($H_2O$) normally present in a packaged MEMS device is replaced with heavy water vapor ($D_2O$) in the packaging process.

Figure 2:
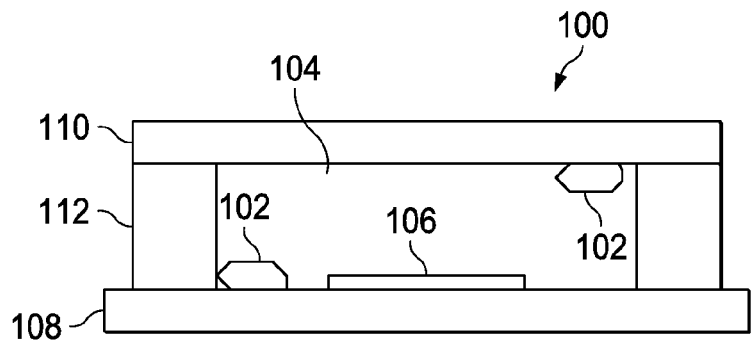
FIG. 2 is a cross-sectional view of a micromirror package showing a getter.

FIG. 2 illustrates a cross-section of a microelectromechanical device package 100. A getter, or desiccant, compound 102 performs a desiccation function as well as providing a reversible source/sink of passivation material in a headspace 104 in which a micromechanical device 106 is enclosed. While the following description describes its use with a PFDA surface treatment material and micromirror device, these examples are for illustration purposes and in no way limit the intended scope of the disclosed invention. The disclosed technology is ideal for any micromechanical device used with an acidic passivant. A preferred embodiment of the passivant is described in U.S. Pub. No. 2008/016,268, which is incorporated by reference herein.

The disclosed desiccant compound has two primary components, a polymer and a drying agent. The polymer acts as both a source and a sink for the surface passivation material, and holds the drying agent in place. The drying agent absorbs water vapor present in the enclosure. Several classes of polymers are available for use in the disclosed desiccant compound. The preferred polymers react with the carboxylic acid passivant available in the package headspace to regulate the amount of passivant vapor available in the package headspace. Specific examples of polymers include polysaccharides (including structural polysaccharides such as cellulose, hydroxypropylcellulose, chitin, their functional derivatives, and others well known to practitioners of the art), polyamines such as poly(2-vinylpyridine), poly(4-vinylpyridine), copolymers of 2-vinylpyridine and 4-vinylpyridine, polyamides such as poly(vinylpyrrolidone), and polysulfones such as poly(p-phenylene sulfone).

Polymers such as polysaccharides, polyamines, polyamides, and polysulfones are basic in nature. Although the conjugate acids of these polymers may have very low $pk_a$ values, their base strengths are sufficient to allow a Bronsted acid-base interaction with the envisioned passivants. The passivation materials envisioned, PFDA and similar carboxylic acids, are acidic. This allows the polymer and passivation material to interact through an acid-base reaction. When acting as a sink for the passivation material, the polymer accepts a proton from a gas phase carboxylic acid, thereby absorbing the carboxylic acid.

The absorbed carboxylic acid can later be released intact by deprotonation of the polymer. Thus, the polymer is a significant source of carboxylic acid passivation materials. Through the constant protonation/deprotonation of the polymer, an equilibrium passivation material vapor pressure is established and maintained in the package headspace. The passivation material vapor reacts with the surfaces of the micromechanical device to replenish the oriented monolayer as it is worn away by contact between components of the micromechanical device.

In addition to providing a reversible source/sink for the passivation material, the polymer provides a binder for the drying agent needed to capture heavy water vapor (and water vapor to the extent present in the package) in the package headspace. The drying agent typically is a molecular sieve, preferably a powdered hydrated aluminosilicate (zeolite) material. Heavy water molecules enter the pores of the molecular sieve where they are adsorbed.

Molecular sieve drying agents are ideal for use in micromirror devices because the adsorbed heavy water vapor is tightly bound to the sieve across a wide temperature range. Micromirror devices are exposed to very intense light. The light elevates the temperature of the micromirror device to well above 65 degrees C. Molecular sieves retain the adsorbed heavy water vapor at temperatures around 300 degrees C. while many other drying agents tend to release the captured water vapor at temperatures above 100 degrees C. The primary benefit of molecular sieves is that they will not completely lose water during thermal stabilization as shown in U.S. Pat. No. 6,204,085 to Strumpell, which is incorporated by reference herein, and that they will modulate the internal package RH over a wide temperature range Since the polymer acts both as a binder and as a source/sink for the passivation material while the zeolite adsorbs heavy water vapor, the polymer-zeolite mixture must provide enough polymer and zeolite to perform both functions. Typically, the zeolite-filled polymer desiccant compound has a polymer to zeolite weight ratio of 1:100 to 1:2.1 in order provide sufficient polymer and zeolite. Preferably, the polymer to zeolite weight ratio range is 1:10 to 1:4.

The polymer-zeolite mixture may be mixed with a suitable carrier solvent prior to being dispensed onto the package or window. A suitable solvent is one that dissolves the host polymer and evaporates without leaving harmful residue. A 2:1 to 1:100 solid to solvent weight ratio typically is used. Preferably, the solid to solvent weight ratio is 1:1 to 1:10.

Depending on the application, the polymer-zeolite mixture 102 is extruded onto a package substrate 108, a package lid or window 110, or a spacer ring 112. The mixture 102 is applied in dots, strips, or any other shape or form that does not interfere with the operation of the device. For example, if the mixture is applied to the package window 110 it must be kept clear of the aperture through which light must pass. If desired, the polymer-zeolite mixture is applied directly to a surface enclosed by the package headspace without the use of a solvent.

Figure 3:
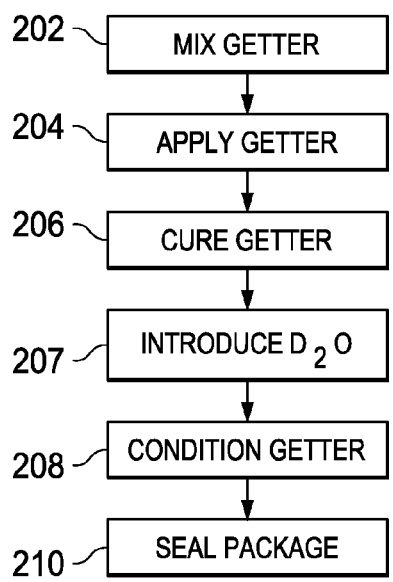
FIG. 3 is a flow diagram showing a first embodiment of forming the getter to include deuterium.

FIG. 3 is a flowchart showing the steps of applying the polymer-zeolite mixture. The polymer, zeolite, and a solvent if necessary, are mixed in step 202 and applied to a package surface in step 204. The mixture can be dispensed on any surface which will be in the package interior after assembly is complete, including a non-moving area or section of the micromechanical device. The polymer-zeolite mixture is cured in step 206. The cure process 206 is preferably performed as described in connection with U.S. Pat. No. 7,090,787, referenced above.

After the polymer-zeolite mixture is cured in step 206, heavy water vapor is introduced to the getter in step 207. While some (about 1%) $D_2O$ occurs naturally in water vapor (about 1%) and some $H_2O$ occurs naturally in heavy water vapor, it is desirable to have a concentration of about 99% heavy water vapor in this step.

The polymer-zeolite mixture is conditioned in step 208 to set the initial moisture content of the zeolite mixture. The conditioning step 208 typically comprises heating the polymer-zeolite mixture in the presence of a vacuum to remove as much heavy water vapor from the zeolite as possible.

The conditioning step 208 may also expose the polymer-zeolite mixture to PFDA vapor. As described above, PFDA from the vapor is absorbed by the polymer to pre-load the polymer. Once the polymer is saturated with PFDA the package is sealed as indicated by step 210. Alternatively, solid PFDA is deposited in the package by other means, and the package sealed as indicated by step 210. After the sealing step, the package is heated, causing the solid PFDA to be absorbed by the desiccant compound.

Using heavy water in the getter will result in a heavy water vapor in the packaged device, replacing bonding between H and the metal with bonding between D and the metal. A bake step as taught in U.S. Pat. No. 6,204,085 to Strumpell, which is incorporated by reference herein, is especially effective in ensuring deuterium incorporation at surface and near-surface sites bearing hydrogen isotopes.

Figure 4:
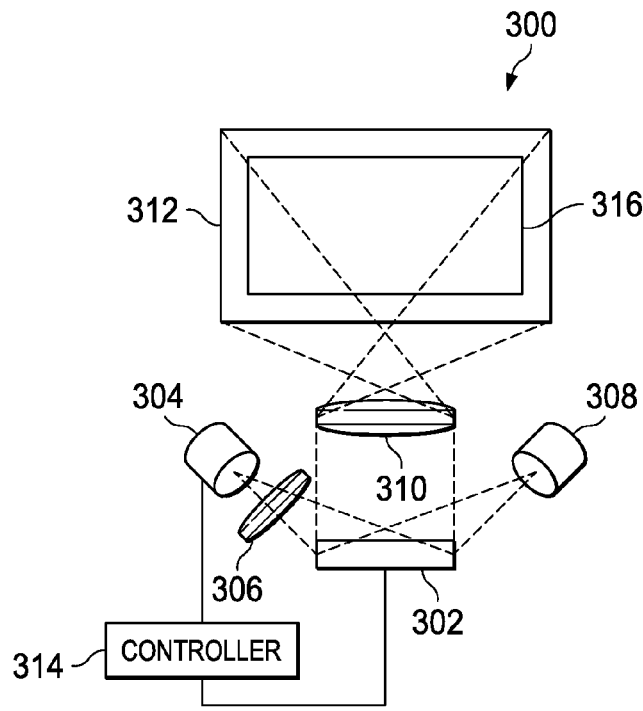
FIG. 4 is a schematic view of a micromirror based video system using the improved MEMS device of FIG. 1.

FIG. 4 is a schematic view of an image projection system 300 using an improved micromirror 302 according to the present invention. In FIG. 4, light from light source 304 is focused on the improved micromirror 302 by lens 306. Although shown as a single lens, lens 306 is typically a group of lenses and mirrors which together focus and direct light from the light source 304 onto the surface of the micromirror device 302. Image data and control signals from controller 314 cause some mirrors to rotate to an on position and others to rotate to an off position. Mirrors on the micromirror device that are rotated to an off position reflect light to a light trap 308 while mirrors rotated to an on position reflect light to projection lens 310, which is shown as a single lens for simplicity. Projection lens 310 focuses the light modulated by the micromirror device 302 onto an image plane or screen 312.

Figure 5:
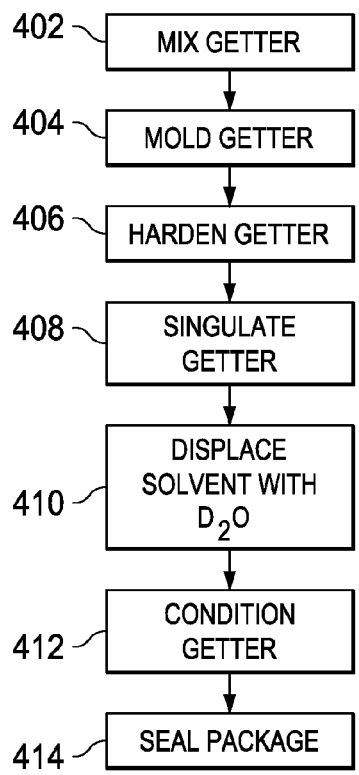
FIG. 5 is a flow diagram showing a second embodiment of forming the getter.

FIG. 5 illustrate a second embodiment of replacing H with D inside the package. In FIG. 5, the getter for the MEMs device is prepared by mixing a zeolite and an organic binder in a solvent to form a paste in step 402. Hexanol is a typical solvent. The paste is then cast or molded into the desired shape in step 404. In step 406, the solvent evaporates quickly from the paste, allowing the binder to harden. Getters are often formed in sheets and cut into individual pieces, called dibs, after the sheets have hardened as indicated by step 408. The individual pieces, however, can be separated at virtually any step of the process. Even after the binder is dried, significant amounts of solvent remain bound up by the zeolite. In the case of a micromirror device, a passivation coating, such as PFDA, is included in the sealed package to reduce the stiction forces and ensure long term operation of the device.

The solvent retained by the zeolite in the getter can have detrimental effects on the operation of the micromechanical device if it is not removed prior to sealing the device package. For example, the solvent can migrate to the contacting surfaces of a micromirror device and cause stiction. Also, the solvent held by the getter reduces the capacity of the getter to hold other contaminates. Furthermore, hexanol reacts with the typical perfluorodecanoic acid (PFDA) passivation coating used in micromirror devices to form other compounds which contaminate the surfaces of the device and cause it to fail.

One of the prior art methods of drying the getters has been to age to the getters to allow them to dry naturally—a process that can take many months to thoroughly remove the solvent from the zeolite. A second alternative is to bake the getters in a vacuum to speed up the drying process. The vacuum bake process is only marginally effective because it does not impart sufficient energy to the solvent to break the bond of the solvent to the zeolite. It has been discovered that the drying process is not classical diffusion, hence heat and pressure are less effective than desired. Instead of relying on classical diffusion, one embodiment of the present invention utilizes a heavy water displacement mechanism, which has been demonstrated to be a much faster process.

One embodiment of a heavy water displacement mechanism, shown in block 410, is to expose the getter to heavy water vapor. The heavy water vapor overwhelms and displaces the solvent in the zeolite getter. After the solvent is displaced, the heavy water vapor is removed as represented by the dry process 412. Because the heavy water vapor does not bind as tightly to the zeolite, the heavy water vapor is removed much easier than the solvent. The heavy water may be removed by allowing the getter to dry naturally, or by a vacuum bake process. Some heavy water, however, will remain in the getter, which will coat the MEMS device.

In another embodiment of a heavy water displacement mechanism, the getter could be initially exposed to $H_2O$ in block 410 to displace the solvent with regular water. The getter could then be exposed to $D_2O$ to displace the $H_2O$ with $D_2O$.

In either embodiment, there will be other compounds present in the getter, such as alcohols and acids, which have active hydrogen atoms. Exposure of the getter to $D_2O$ will result in an exchange of hydrogen atoms with deuterium atoms in these compounds, which could also have the beneficial effects described herein.

The drying is a continuous function of time, temperature, and relative humidity. While any relative humidity and temperature may eventually displace enough of the solvent, the higher the temperature and relative humidity, the shorter the time required to reach a given level of dryness. One embodiment of the present invention exposes the getters to a 60% relative humidity heavy water vapor at 85 degrees C. for two hours. Another embodiment of the present invention exposes the getters to a 60% relative humidity heavy water vapor at 85 degrees C. for six hours. After exposure to the heavy water vapor, the getters are dried in a vacuum bake. Exposure to the water vapor speeds drying from greater than 30 days to less than 1 day. The reduction in cycle time not only avoids the excess inventory and reduces the lead time required to prepare the getters, it frees up valuable clean room space that was previously used to store the getters while they were drying. The heavy water vapor displacement method also results in less solvent in the dried getter, which not only increases the available capacity of the getter to trap water, but also reduces the contaminants formed by reactions between the residual solvent and PFDA. Typically, the contaminants in the headspace are reduced from approximately 10% to approximately 0.1%. Therefore, the water displacement method described herein not only results in a cost savings in the manufacture of the getters, it also provides for reliable device performance under extended storage and operating conditions.

After drying, the getter is sealed with the micromirror device in the package in step 414. The D thus incorporated as heavy water will be available to the package and device surfaces. As the preponderance of available hydrogen isotope will be deuterium, the energetic advantages of this arrangement, vide supra, can be realized.

A third embodiment of the present invention is to using a passivation coating including deuterium in step 12 of FIG. 1. Exposing the surface of a MEMS device using a carboxylic acid passivation coating, such PFDA is described in U.S. Pat. Nos. 5,331,454 and 5,602,671.

In general, a small quantity of the passivating source material is placed in a container with the MEMS device in a vacuum oven. As the passivating source material melts, it produces a vapor that deposits a passivating layer on the exposed and activated surfaces of the devices. After the deposition is finished, the cover of the container is removed and the oven is evacuated and continuously pumped to eliminate any excess source material, ensuring that only the passivating layer remains on the devices.

In this embodiment of the invention, rather than use a carboxylic acid of the type R—COOH, where R=$CH_3$ $(CH_2)_n$, as the source material, a variation using deuterium is used in its place. For example, a source material of $CD_3(CD_2)_n COOH$ could be used or $CH_3(CH_2)_n COOD$ could be used.

Alternatively, a normal passivating source material could be used in an ambient of heavy water vapor. This will cause an equilibrium state of $D_2O+R$—COOH↔$H_2O+R$—COOD+DHO. Any shift in the equilibrium to add replace H with D will cause some reduction in stiction; it is desirable to increase R—COOD to about 30% of the passivation vapor to provide significant reduction in stiction although a lower percentage of R—COOD could still provide benefits as described herein.

Even if R—COOD or $CD_3(CD_2)_n COOH$ is available, it would be beneficial to use $D_2O$ as the ambient to maintain a high concentration of D.

In addition to the benefits provided with regard to stiction, the use of D to coat the MEMS device can have other benefits as well. In a DMD, for example, it has been known that water vapor in the device can cause oxidation on the aluminum parts, particularly the posts connected to the mirrors. During operation, the posts deflect between on and off states. Various oxides formed on the posts can cause a bias in a mirror which has been attracted to one state more than the other. While this has been described in connection with aluminum posts, it would be true using other metals, such as aluminum alloys, titanium, and titanium alloys, as well.

Replacing H with D will reduce the isomerization, exchange and atom transfer rates of surface reactions of metal oxides and oxyhydroxides which play a role in accumulation of plastic deformation of freestanding metal thin films used in MEMS devices, thus reducing biasing.

Thus, the present invention, which replaces H with D in a MEMS device provides significant advantages over the prior art. First, the static friction between contacting surfaces of MEMS components is reduced. Second, deuteration of bound water, hydrogen, PFDA and other species reduced the bonding vibrational constants for the D—X bonds. Third, reducing the isomerization, exchange and atom transfer rates of surface reactions of metal oxides reduces deformation of MEMS components.

It should be noted that any increase of D above the naturally occurring 1% in water (or above the naturally occurring level of D in other compounds which contain an isotope of H) should provide a measure of improvement in reducing stiction and deformation in MEMS components. Larger increases will cause greater improvements. A very significant improvement should be seen where 30% of H atoms are replaced by D atoms in compounds that contain an isotope of H. In some instances it may be possible to provide a compound where D constitutes 90% or more of the H and H isotopes within the compound, which would provide optimum benefits.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A process for packaging a MEMS device, comprising the steps of:
    placing the MEMS device in a package;
    introducing a material including deuterium at levels beyond a naturally occurring level into the package; and
    sealing the package;
    wherein the introducing step comprises the step of introducing water into the package wherein the water includes deuterium at levels beyond a naturally occurring level for water.

2. The process of claim 1, wherein the percentage of deuterium in the water is more than 1% of the hydrogen in the water.

3. The process of claim 2, wherein the percentage of deuterium in the water is more than 30% of the hydrogen in the water.

4. The process of claim 1, wherein the introducing step comprises the step of introducing heavy water into a getter.

5. The process of claim 4, wherein the step of introducing heavy water into the getter comprises the step of displacing solvent in the getter with heavy water.

6. The process of claim 4, wherein the step of introducing heavy water into the getter comprises the step of displacing non-heavy water in the getter with heavy water.

7. A process for packaging a MEMS device, comprising the steps of:
    placing the MEMS device in a package;
    introducing a material including deuterium at levels beyond a naturally occurring level into the package; and
    sealing the package;
    wherein the introducing step comprises the step of introducing a passivating source material with deuterium into the package in an ambient of heavy water vapor.

8. A process for packaging a MEMS device, comprising the steps of:
    placing the MEMS device in a package;
    introducing a material including deuterium at levels beyond a naturally occurring level into the package; and
    sealing the package;
    wherein the introducing step comprises the step of introducing a passivating source material including deuterium into the package; and
    wherein the passivating material includes $CH_3(CH_2)n COOD$.

9. A process for packaging a MEMS device, comprising the steps of:
    placing the MEMS device in a package;
    introducing a material including deuterium at levels beyond a naturally occurring level into the package; and
    sealing the package;
    wherein the introducing step comprises the step of introducing a passivating source material including deuterium into the package; and
    wherein the passivating material includes $CD_3(CD_2)n COOH$.

10. A packaged MEMS device, comprising:
a MEMS device;
a sealed package surrounding the MEMS device; and
a material including deuterium at levels beyond a naturally occurring level disposed in the package;
wherein the material includes water with deuterium at levels beyond a naturally occurring level for water.

11. The packaged MEMS device of claim 10, wherein the percentage of deuterium in the water is more than 1% of the hydrogen in the water.

12. The packaged MEMS device of claim 11, wherein the percentage of deuterium in the water is more than 30% of the hydrogen in the water.

13. The packaged MEMS device of claim 10, wherein the material comprises a getter including heavy water.

14. A packaged a MEMS device, comprising:
a MEMS device;
a sealed package surrounding the MEMS device;
a material including deuterium at levels beyond a naturally occurring level disposed in the package;
wherein the material is a passivating source material including deuterium; and
wherein the passivating material includes $CH_3(CH_2)n COOD$.

15. A packaged a MEMS device, comprising:
a MEMS device;
a sealed package surrounding the MEMS device;
a material including deuterium at levels beyond a naturally occurring level disposed in the package;
wherein the material is a passivating source material including deuterium; and
wherein the passivating material includes $CD_3(CD_2)n COOH$.

16. The method of claim 4, wherein the getter is a dessicant compound including a polymer and a drying agent.

17. The method of claim 16, wherein the drying agent comprises a zeolite material.

18. The method of claim 17, wherein the polymer comprises at least one of a polysaccharide, a polyamine, a polyamide or a polysulfone.

19. The method of claim 18, wherein the drying agent comprises powdered hydrated aluminosilicate material.

20. The method of claim 17, wherein the dessicant compound is a polymer-zeolite mixture with a polymer to zeolite weight ratio of 1 part polymer to 2.1 to 100 parts zeolite.

21. The method of claim 20, wherein the polymer to zeolite weight ratio is 1 part polymer to 4 to 10 parts zeolite.

22. The method of claim 21, wherein the polymer-zeolite mixture is mixed with a carrier solvent prior to being introduced into the package.

23. The method of claim 22, wherein the polymer-zeolite mixture comprises a solid mixed with the carrier solvent at a solid to solvent weight ratio of 1 part solid to 0.5 to 100 parts solvent.

24. The method of claim 23, wherein the solid to solvent ratio is 1 part solid to 1 to 10 parts solvent.

25. The method of claim 16, wherein the introducing step includes:
introducing a polymer-zeolite mixture into the package;
curing the introduced polymer-zeolite mixture; and
introducing heavy water to the cured polymer-zeolite mixture.

26. The method of claim 25, wherein the introducing step includes heating the polymer-zeolite mixture in a vacuum to remove heavy water vapor for setting an initial moisture content of the polymer-zeolite mixture.

27. The method of claim 26, further comprising exposing the polymer-zeolite mixture to perfluorodecanoic acid (PFDA).

28. The method of claim 10, wherein the material is a dessicant compound including a polymer and a drying agent.

29. The method of claim 28, wherein the drying agent comprises a zeolite material.

30. The method of claim 29, wherein the polymer comprises at least one of a polysaccharide, a polyamine, a polyamide or a polysulfone.

31. The method of claim 30, wherein the drying agent comprises powdered hydrated aluminosilicate material.

32. The method of claim 30, wherein the MEMS device is a micromirror device.

* * * * *